(12) United States Patent
Hong

(10) Patent No.: US 7,344,937 B2
(45) Date of Patent: Mar. 18, 2008

(54) METHODS AND APPARATUS WITH SILICIDE ON CONDUCTIVE STRUCTURES

(75) Inventor: Sungkwon C. Hong, Boise, ID (US)

(73) Assignee: Micron Technology, Inc., Boise, ID (US)

(*) Notice: Subject to any disclaimer, the term of this patent is extended or adjusted under 35 U.S.C. 154(b) by 37 days.

(21) Appl. No.: 11/339,839

(22) Filed: Jan. 26, 2006

(65) Prior Publication Data

US 2006/0205137 A1 Sep. 14, 2006

Related U.S. Application Data

(63) Continuation of application No. 10/910,360, filed on Aug. 4, 2004, now Pat. No. 7,012,000, which is a continuation of application No. 10/751,941, filed on Jan. 7, 2004, now Pat. No. 6,900,507.

(51) Int. Cl.
  *H01L 29/72* (2006.01)
(52) U.S. Cl. .................. 438/211; 438/230; 438/299; 438/592; 257/444
(58) Field of Classification Search ........... 438/211, 438/230, 299, 592; 257/444
  See application file for complete search history.

(56) References Cited

U.S. PATENT DOCUMENTS

| | | | |
|---|---|---|---|
| 5,086,370 A | 2/1992 | Yasaitis | |
| 6,143,613 A | 11/2000 | Lin | |
| 6,194,258 B1 | 2/2001 | Wuu | |
| 6,372,640 B1 | 4/2002 | Chen et al. | |
| 6,383,882 B1 | 5/2002 | Lee et al. | |
| 6,391,767 B1 | 5/2002 | Huster et al. | |
| 6,414,342 B1 | 7/2002 | Rhodes | |
| 6,420,273 B1* | 7/2002 | Lin | 438/706 |
| 6,518,618 B1 | 2/2003 | Fazio et al. | |
| 6,528,381 B2 | 3/2003 | Lee et al. | |
| 6,583,052 B2 | 6/2003 | Shin et al. | |
| 6,602,774 B1 | 8/2003 | Fontana et al. | |
| 6,667,204 B2 | 12/2003 | Kim | |
| 6,667,233 B2 | 12/2003 | Ryoo et al. | |
| 6,700,163 B2 | 3/2004 | Breitwisch et al. | |
| 6,737,291 B1 | 5/2004 | Lim | |
| 7,012,000 B2* | 3/2006 | Hong | 438/211 |
| 2001/0012225 A1 | 8/2001 | Rhodes | |
| 2003/0082881 A1 | 5/2003 | Chang et al. | |
| 2004/0104412 A1* | 6/2004 | Rhodes | 257/292 |

* cited by examiner

*Primary Examiner*—Edward Wojciechowicz
(74) *Attorney, Agent, or Firm*—Dickstein Shapiro LLP

(57) ABSTRACT

Exemplary embodiments of the invention provide pixel circuits having transistors with silicide on top of their gate stacks. In the exemplary embodiments, silicide forming material does not contaminate other components such as the photoconversion devices of an imager integrated circuit (IC). The photoconversion devices are blocked during silicide formation and are therefore not contaminated with silicide or metallic components. In other exemplary embodiments, each pixel of an imager also includes an optional in-pixel capacitor that has stabilized capacitance versus voltage characteristics due to its metal-dielectric-polysilicon structure, where the metal is a metal silicide over a conductive silicon layer.

17 Claims, 16 Drawing Sheets

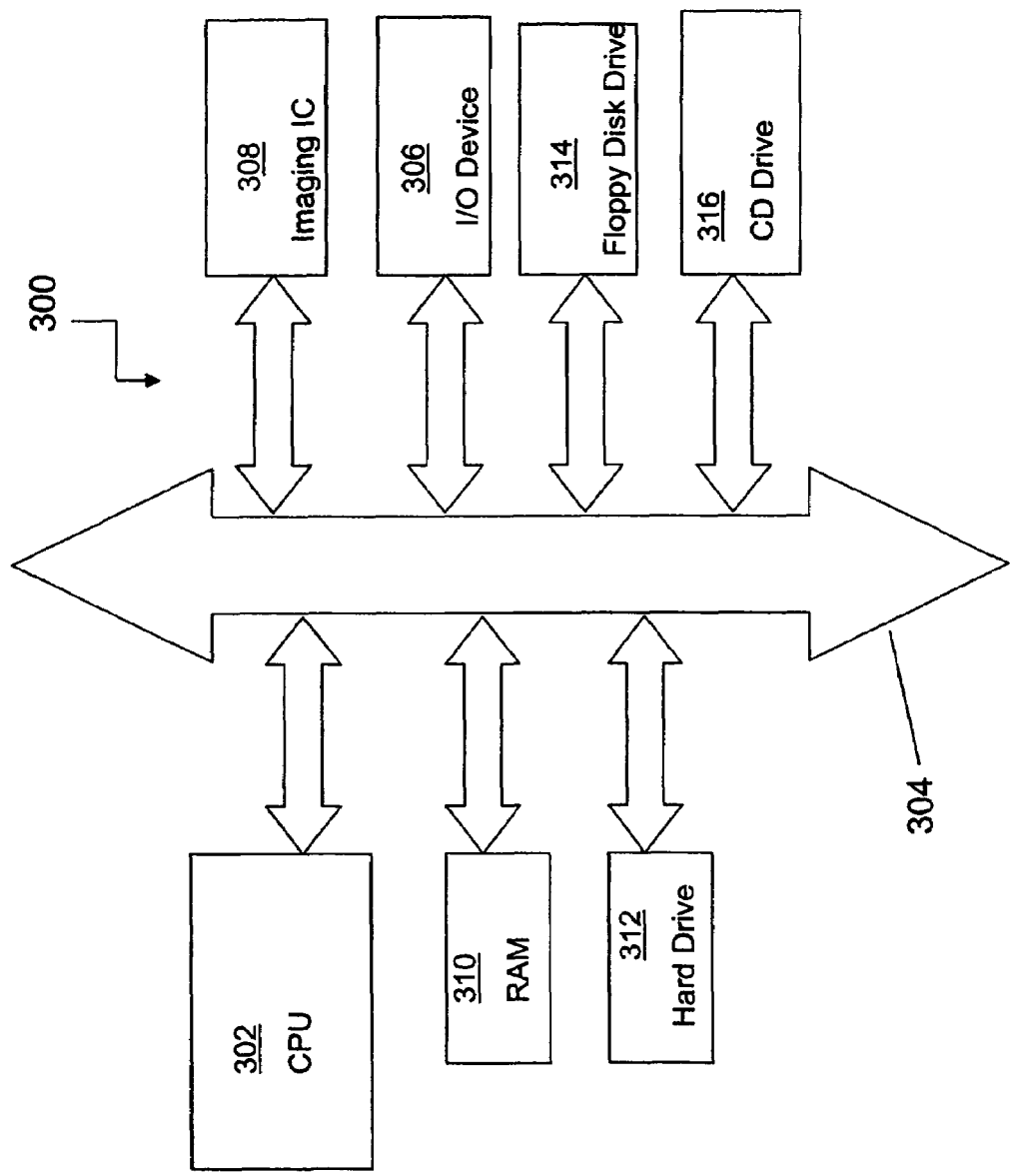

METHODS AND APPARATUS WITH SILICIDE ON CONDUCTIVE STRUCTURES

The present application is a continuation of application Ser. No. 10/910,360, filed Aug. 4, 2004 now U.S. Pat. No. 7,012,000, which is a continuation of Ser. No. 10/751,941, filed Jan. 7, 2004 now U.S. Pat. No. 6,900,507, the entire disclosures of which are incorporated herein by reference.

FIELD OF THE INVENTION

The invention relates generally to imagers and in particular, to imagers with a silicide layer on conductive structures of each pixel.

BACKGROUND

Many imagers and other integrated circuits (ICs) include conductive structures formed over a substrate's surface. For example, the conductive structures could be gates of transistors or electrodes of capacitors. Such structures are often formed of doped semiconductor material, such as doped polysilicon.

Typically, an imager IC includes a focal plane array of pixel cells, each one of the cells including a photoconversion device such as, e.g., a photogate, photoconductor, or a photodiode. In a CMOS imager, each pixel cell also includes readout circuitry, typically including a source follower output transistor. The photoconversion device converts photons to free electrons, which are typically transferred to a floating diffusion region connected to the gate of the source follower output transistor. A charge transfer device (e.g., transistor) can be included for transferring charge from the photoconversion device to the floating diffusion region. In addition, such imager cells typically have a transistor for resetting the floating diffusion region to a predetermined charge level prior to charge transfer. The output of the source follower transistor is a voltage output on a column line when a row select transistor for the row containing the pixel is activated.

Exemplary CMOS imaging circuits, processing steps thereof, and detailed descriptions of the functions of various elements of an imaging circuit are described, for example, in U.S. Pat. No. 6,140,630, U.S. Pat. No. 6,376,868, U.S. Pat. No. 6,310,366, U.S. Pat. No. 6,326,652, U.S. Pat. No. 6,204,524, and U.S. Pat. No. 6,333,205, assigned to Micron Technology, Inc. The disclosures of the foregoing patents are hereby incorporated by reference in their entirety.

In a CMOS imager in which each pixel cell includes a photodiode, when incident light strikes the surface of the photodiode, electron/hole pairs are generated in the p-n junction of the photodiode. The generated electrons are initially collected in the n-type region of the photodiode. The photogenerated charge moves from the initial charge accumulation region to the floating diffusion region or it may be transferred to the floating diffusion region via a transfer transistor. The charge at the floating diffusion region is typically converted to a pixel output voltage by a source follower transistor (described above).

Some conventional imagers employ polysilicon in the gate stacks of the pixel transistors. Transistors with polysilicon gates, but without a metallic material (e.g., metal silicide) on the polysilicon, can have high gate resistivity problems. High gate resistivity can decrease operational speed. Accordingly, some imagers have attempted to alleviate the problem by using tungsten silicides ($WSi_x$) on the tops of polysilicon gates. However, complex process steps are required to form $WSi_x$ polysilicon gates and it becomes more difficult to define both n-channel and p-channel metal-oxide-semiconductor field effect transistors (MOSFETs) with $WSi_x$ gates. Other problems, such as cross dopant contamination between NMOSFETs and PMOSFETs, are more likely to occur during the production of $WSi_x$ polysilicon gates.

Moreover, a blanket deposition of a silicide forming material can be detrimental to a photoconversion device. For example, high dark current can occur due to tungsten contamination of the photoconversion device area during the gate etch process when tungsten attacks the surface of the photoconversion device.

It would be advantageous to have improved conductive structures with silcides over doped silicon material, and also to have improved techniques for producing such structures.

SUMMARY

Exemplary embodiments of the invention provide pixel circuits having transistors with silicide on top of their gate stacks. In the exemplary embodiments, silicide forming material does not contaminate other components such as the photoconversion devices of an imager integrated circuit (IC). The photoconversion devices are blocked during silicide formation and are therefore not contaminated with silicide or metallic components. In other exemplary embodiments, each pixel of an imager also includes an optional in-pixel capacitor that has stabilized capacitance versus voltage characteristics due to its metal-dielectric-polysilicon structure, where the metal is a metal silicide over a conductive silicon layer.

BRIEF DESCRIPTION OF THE DRAWINGS

Additional features of exemplary embodiments of the present invention will be apparent from the following detailed description and drawings, in which:

FIG. 16 is a diagram of a processing system that includes an imager IC as in FIG. 15.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed, with the exception of steps necessarily occurring in a certain order.

The terms "wafer" and "substrate," as used herein, are to be understood as including silicon, silicon-on-insulator (SOI) or silicon-on-sapphire (SOS) technology, doped and undoped semiconductors, and other semiconductor or insulating structures. Furthermore, when reference is made to a "wafer" or "substrate" in the following description, previous processing steps may have been utilized to form regions, junctions, or material layers in or over the base semiconductor or insulating structure or foundation. In addition, a semiconductor wafer or substrate need not be silicon-based, but could be based on silicon-germanium, germanium, gallium arsenide or other semiconductors.

The term "pixel," as used herein, refers to a photo-element unit cell containing a photoconversion device and associated components such as transistors for converting photons to an electrical signal. For purposes of illustration, a single representative pixel and its manner of formation is illustrated in the figures and description herein; however, typically fabrication of a plurality of like pixels proceeds simultaneously. Accordingly, the following detailed description is not to be taken in a limiting sense, and the scope of the present invention is defined only by the appended claims.

In the following description, the invention is described in relation to a CMOS imager for convenience; however, the invention has wider applicability to any type of imager, for example a CCD imager. More generally, the invention can be applied in any device in which a conductive semiconductor structures on a substrate have a metal silicide layer on their tops.

Figure 1:
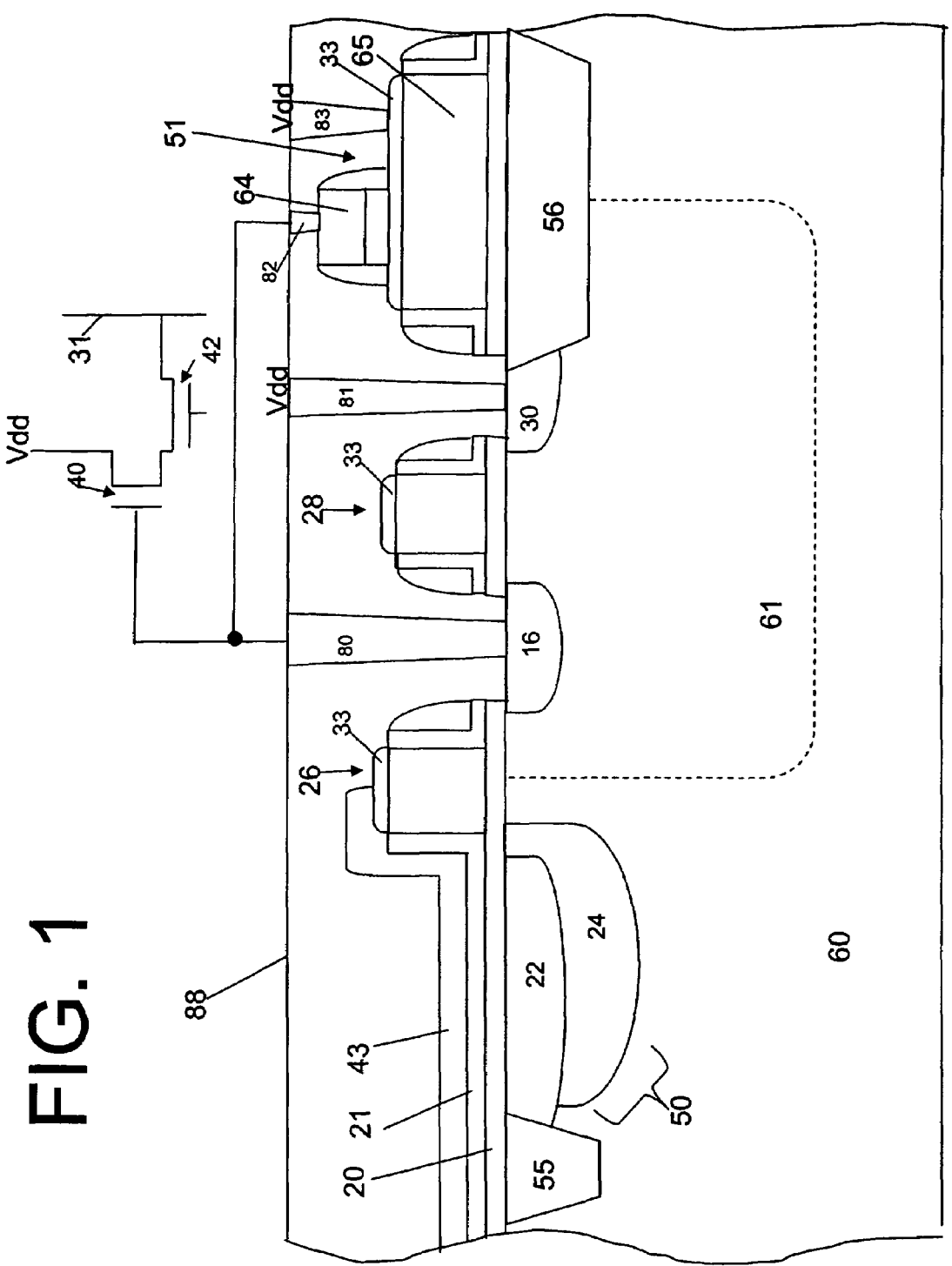
FIG. 1 is a cross-sectional view of a portion of an image sensor pixel cell according to an exemplary embodiment of the invention.

Now referring to the figures, where like reference numbers designate like elements, FIG. 1 illustrates a pixel sensor cell constructed in accordance with an exemplary embodiment of the invention. A photoconversion device 50 is formed in a substrate 60 that for exemplary purposes is a p-type substrate. The illustrated photoconversion device 50 is a photodiode and may be a p-n junction photodiode, a Schottky photodiode, or any other suitable photodiode, but for exemplary purposes is discussed as a p-n-p photodiode. The exemplary p-n-p photodiode 50, as shown in FIG. 1, includes a p+ region 22 and an n-type region 24.

The remaining structures shown in FIG. 1 include a transfer transistor with associated gate 26 and a reset transistor with associated gate 28. Floating diffusion region 16 and source/drain region 30 are formed in a doped layer or well 61, which is a p-type well for exemplary purposes.

Shallow trench isolation (STI) regions 55 and 56 are also shown. A source follower transistor 40 and row select transistor 42 with associated gates similar to gates 26, 28 are also included in the pixel sensor cell in electrical schematic form for convenience purposes only. The row select transistor 42 is connected to provide an output signal on column line 31. Although FIG. 1 shows a four-transistor (4T) configuration with a transfer transistor, other exemplary embodiments of the invention can include a three-transistor (3T) pixel configuration, without a transfer transistor, and pixels with other transistor number configurations (e.g. 2T, 5T, etc.).

In the exemplary embodiment shown in FIG. 1, the transfer transistor gate 26 and reset transistor gate 28 (and the gates of transistors 40 and 42 (not shown)) have a silicide cap 33. The silicide cap 33 is aligned with, and according to the illustrated embodiment, on top of a polysilicon layer of the gates 26, 28. Silicide cap 33 can be self aligned silicide or "salicide," produced by a process to be described below. According to an embodiment of the invention, and as discussed below, the silicide is formed such that it does not contaminate the photoconversion device (e.g. photoconversion device 50) or other areas of the pixel where silicide forming material or silicide would have a detrimental effect.

In addition, in the illustrated embodiment an optional in-pixel capacitor 51, having a polysilicon bottom electrode 65 and a metal top electrode 64, is positioned over STI region 56. The in-pixel capacitor 51 has stabilized capacitance versus voltage characteristics due to its metal-dielectric-polysilicon structure. The resistivity of bottom electrode 65 is also reduced by silicide cap 33. In an alternative embodiment, the in-pixel capacitor 51 is omitted.

FIGS. 2-14 show one exemplary method of forming the pixel sensor cell of FIG. 1 at various stages of processing. For convenience, the same cross-sectional view of FIG. 1 is shown in FIGS. 2-14, and the source follower 40 and row select 42 transistors are not illustrated.

Figure 2:
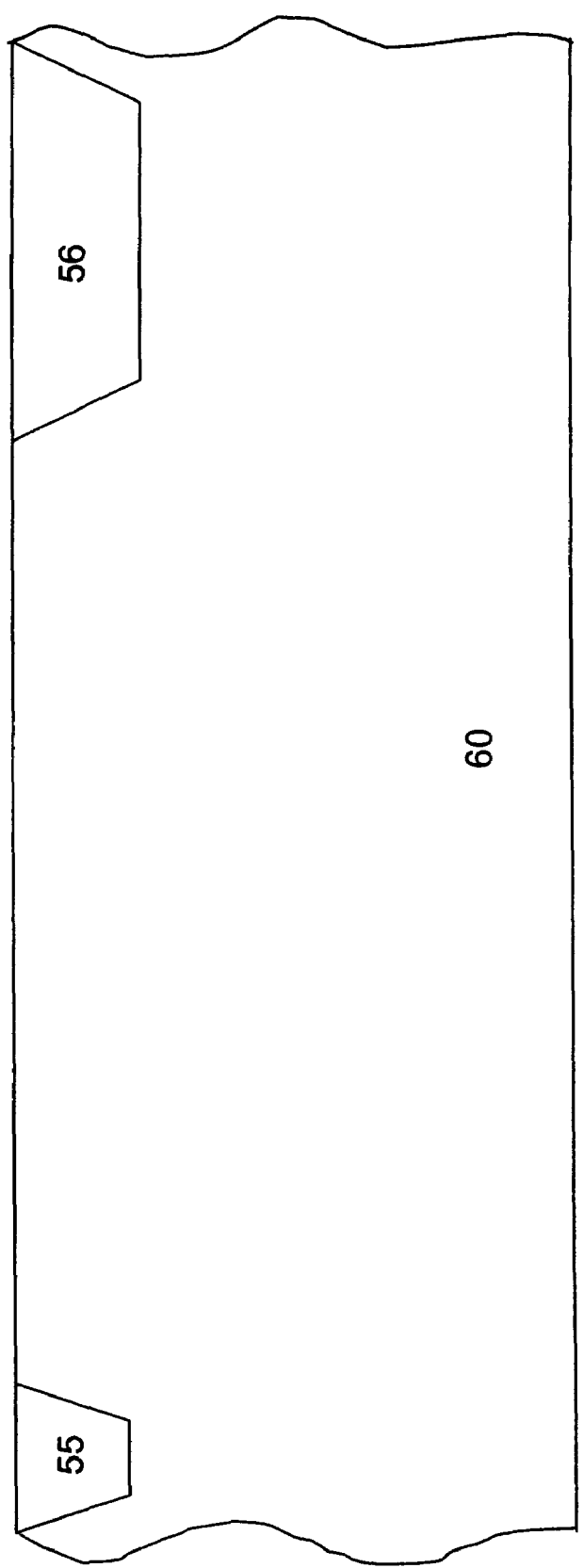
FIG. 2 shows a cross-sectional view of a portion of the FIG. 1 pixel cell during an initial stage of processing performed in accordance with a method of the invention.

Referring to FIG. 2, first a p-type silicon substrate 60 is provided. Isolation region 55 is formed to surround and electrically isolate regions of the substrate 60 where pixel cells will later be formed. Similarly, isolation region 56 is formed to provide isolation between substrate 60 and capacitor 51 (if capacitor 51 is included in the cell). The isolation regions 55, 56 can be formed by any known or hereafter developed technique such as thermal oxidation of the underlying silicon in a LOCOS process, or by etching trenches and filling them with oxide in an STI (shallow trench isolation) process. Isolation region 56, in the illustrated embodiment of the invention, is formed such that it is wider than isolation region 55. In one embodiment of the invention, a capacitor 51 is subsequently formed over isolation region 56.

Figure 3:
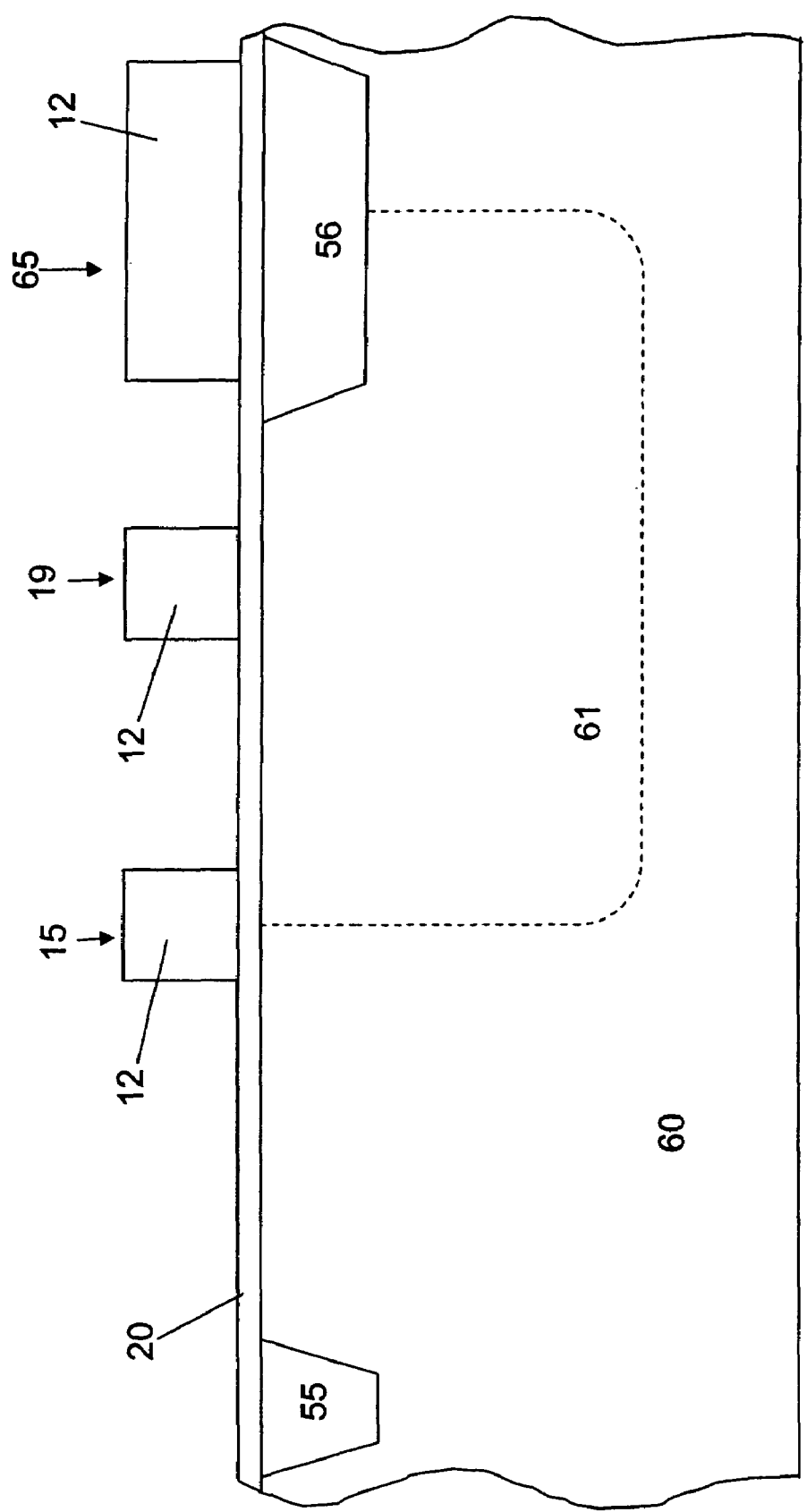
FIG. 3 shows a stage of processing subsequent to that shown in FIG. 2.

As shown in FIG. 3, p-type well 61 is formed by blanket implantation or by masked implantation as is known in the art. P-type well 61 may be formed before or after the formation of isolation regions 55, 56 and gate stacks 15, 19. The p-well implant may be conducted so that the pixel array well 61 and an n-type periphery logic well (not shown), which will contain logic circuits for controlling the pixel array, have different doping profiles. As known in the art, multiple high energy implants may be used to tailor the profile and position of the p-type well 61.

Figure 4:
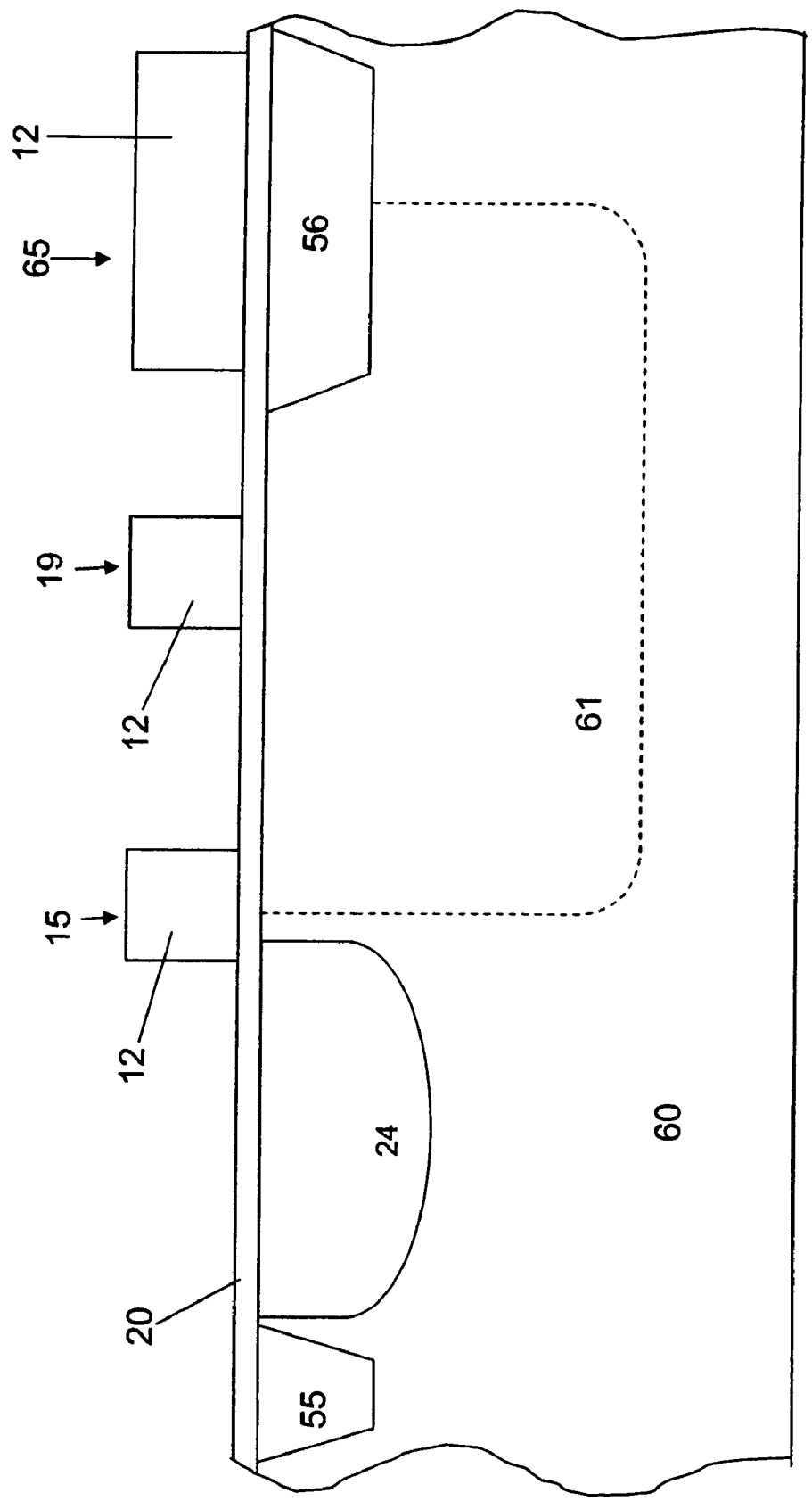
FIG. 4 shows a stage of processing subsequent to that shown in FIG. 3.

FIG. 3 also depicts the formation of a gate oxide layer 20. The two gate stacks 15, 19 are formed over gate oxide layer 20 and are used for a transfer transistor and reset transistor, respectively. Although not shown, gate stacks for other transistors are also formed at this time. The gate stacks 15, 19 include portions of a polysilicon layer 12 that is doped to make it conductive. A bottom electrode 65 for capacitor 51 (FIG. 1) also includes a portion of doped polysilicon layer 12 optionally formed over isolation region 56. FIG. 4 shows n-type implanted region 24 of the photodiode 50 (FIG. 1). Although the embodiments shown in FIGS. 2-14 have an optional capacitor 51, the invention can be utilized without capacitor 51. Region 24 may be implanted by any method known in the art or hereafter developed. A p-type region 22 of the photodiode, shown in FIG. 12, can also be implanted at this time or at a later time.

Figure 5:
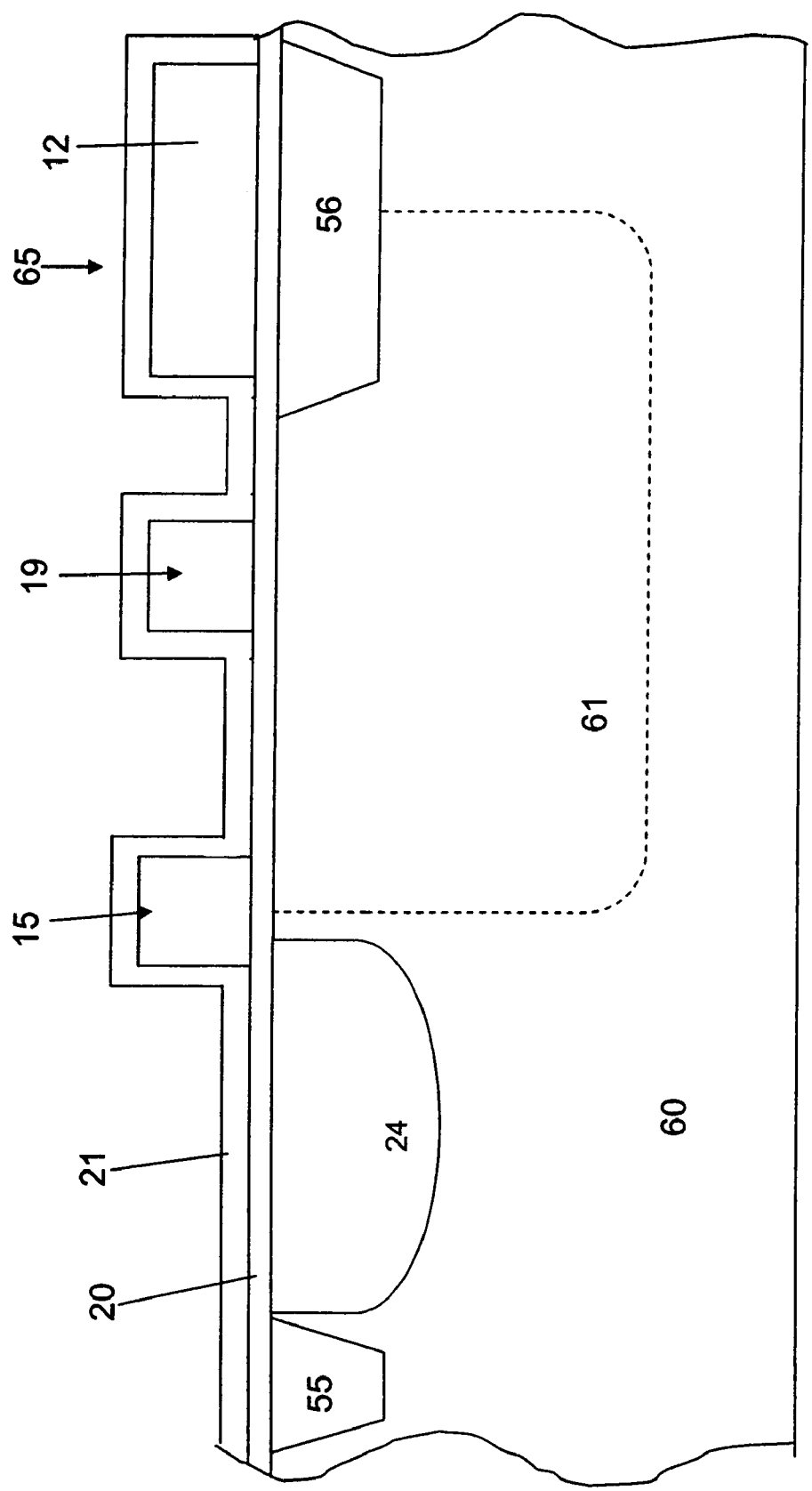
FIG. 5 shows a stage of processing subsequent to that shown in FIG. 4.

Referring to FIG. 5, a silicon nitride ($Si_3N_4$) layer 21 is formed over the pixel area, including gate stacks 15, 19 and bottom electrode 65. Layer 21 acts as a selectively etchable layer or etch stop and can be formed with other suitable materials. Layer 21 is deposited such that structures including areas over the photodiode 50 (FIG. 1), gate stacks, capacitor and regions over source/drain areas are covered.

Figure 6:
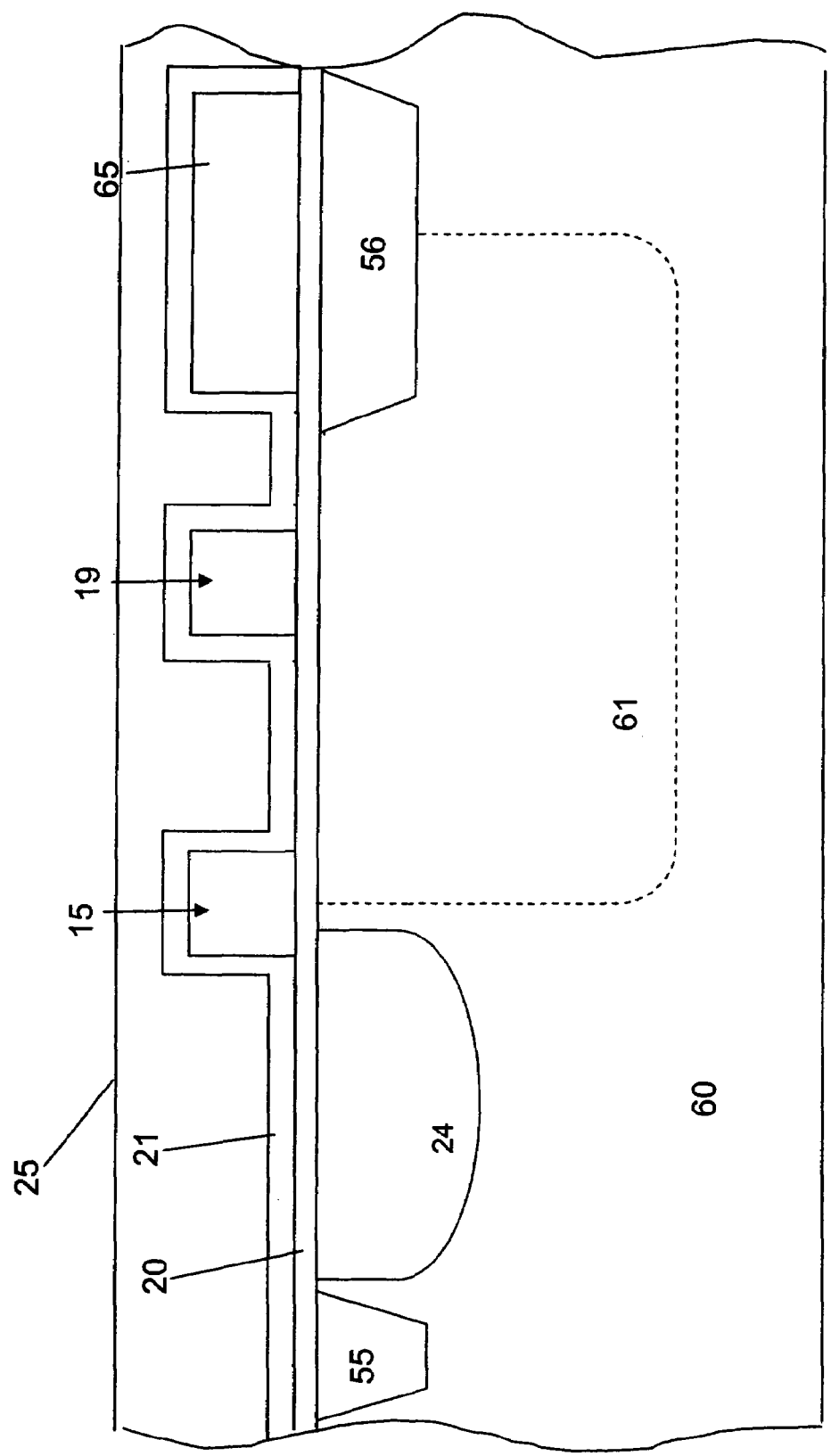
FIG. 6 shows a stage of processing subsequent to that shown in FIG. 5.

Next, as shown in FIG. 6, a thick layer 25 of silicon dioxide ($SiO_2$) is formed over the entire pixel area. In the illustrated embodiment, layer 25 is then planarized, for example, by chemical mechanical polishing (CMP) or other planarizing technique exposing layer 21 on the tops of gate stacks 15, 19 and bottom electrode 65 (not shown).

Figure 7:
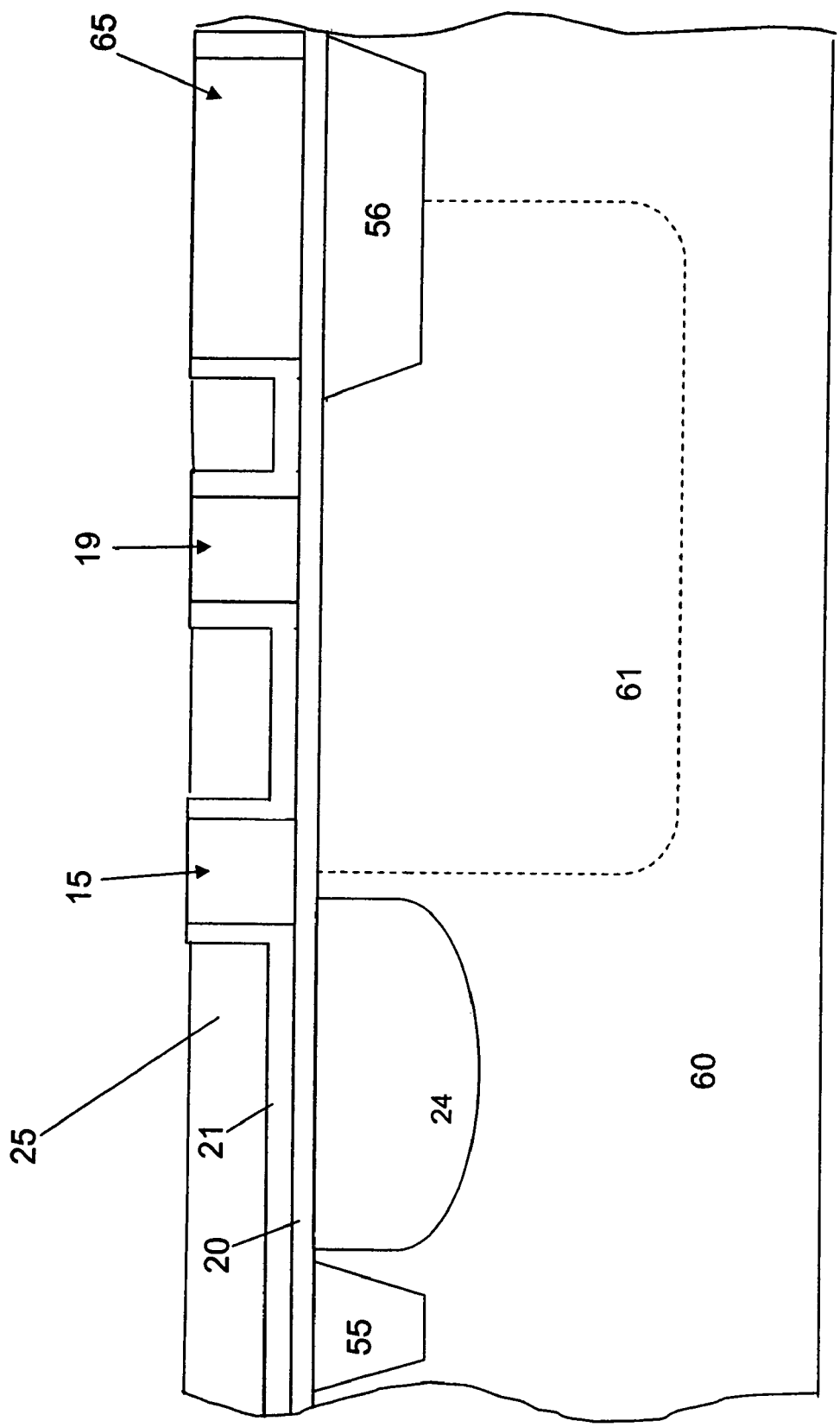
FIG. 7 shows a stage of processing subsequent to that shown in FIG. 6.

A wet etch is performed to remove exposed portions of layer 21 and to also expose the regions where silicide will be formed. In FIG. 7, portions of layer 21 on the tops of gate stacks 15, 19 and the top of bottom electrode 65 have been etched away to expose polysilicon layers of the gate stacks 15, 19 and bottom electrode 65.

Figure 8:
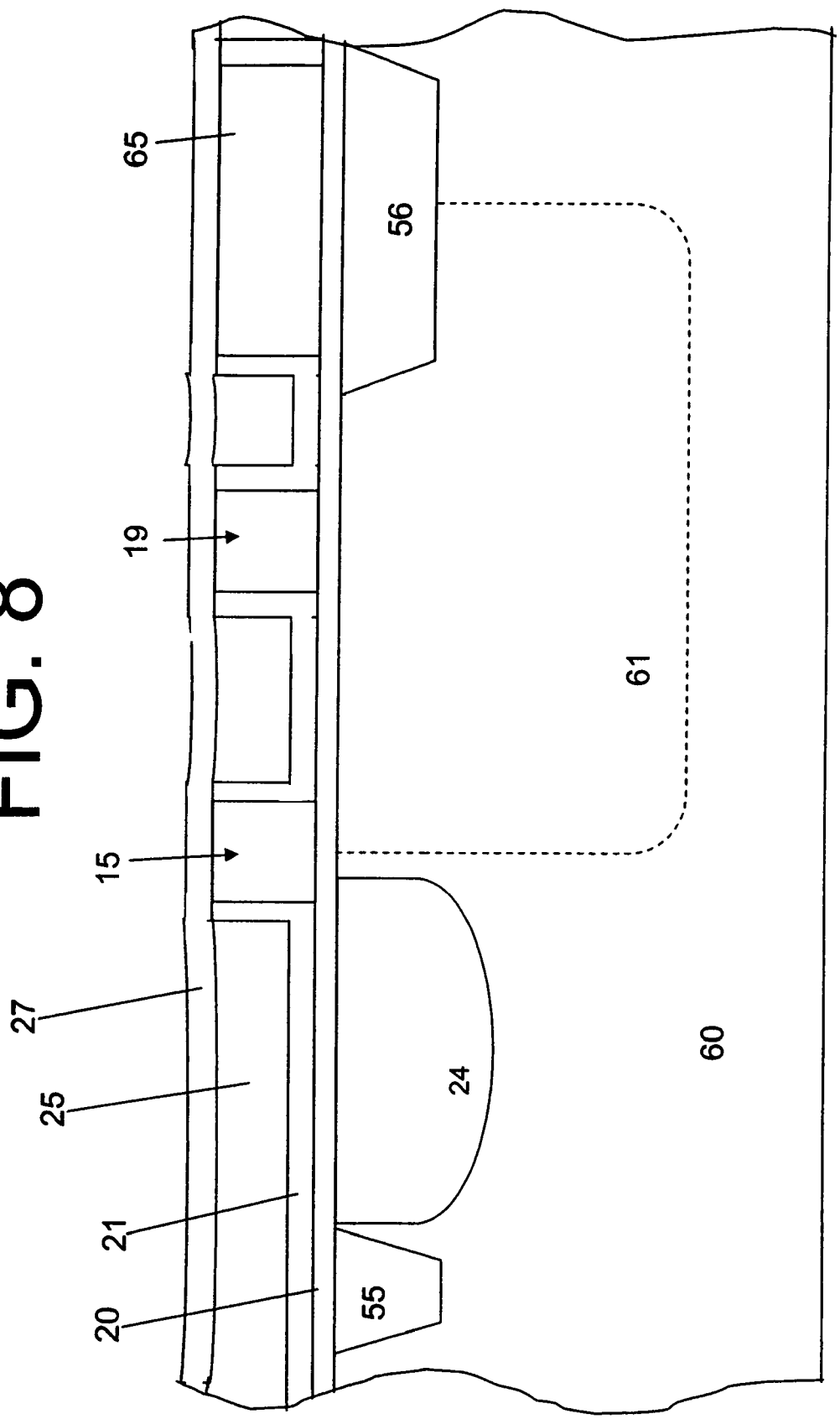
FIG. 8 shows a stage of processing subsequent to that shown in FIG. 7.

As shown in FIG. 8, a metal layer 27 is deposited over the entire pixel area. Layer 27 may be formed of any metal suitable for silicide formation on polysilicon including, but not limited to, cobalt, tungsten, titanium or nickel. Layer 27 may be deposited by sputtering, for example, and is deposited to a thickness of about 200 Å to about 400 Å across the wafer surface.

A first anneal process such as a rapid thermal anneal (RTA) is performed, where the temperature is raised quickly to spike at a predetermined temperature and brought down quickly. The first anneal, according to the present embodiment, occurs in a nitrogen atmosphere at a temperature of about 800° C., which causes the metal layer 27 to react with exposed polysilicon in the gate stacks 15, 19 and bottom electrode 65 to form a metal silicide. A metal silicide layer forms only on those areas of exposed polysilicon, which in this embodiment are the tops of the gate stacks 15, 19 and the top of bottom electrode 65. The silicide layer's edges align with the edges of the surfaces on which it forms. Metal silicide provides an ohmic contact between polysilicon and subsequently deposited metal, greatly reducing resistivity. In other areas of the cell, metal layer 27 over $SiO_2$ layer 25 is unchanged, so that the silicide is aligned to the exposed polysilicon. This is called self aligned silicide or salicide.

Figure 9:
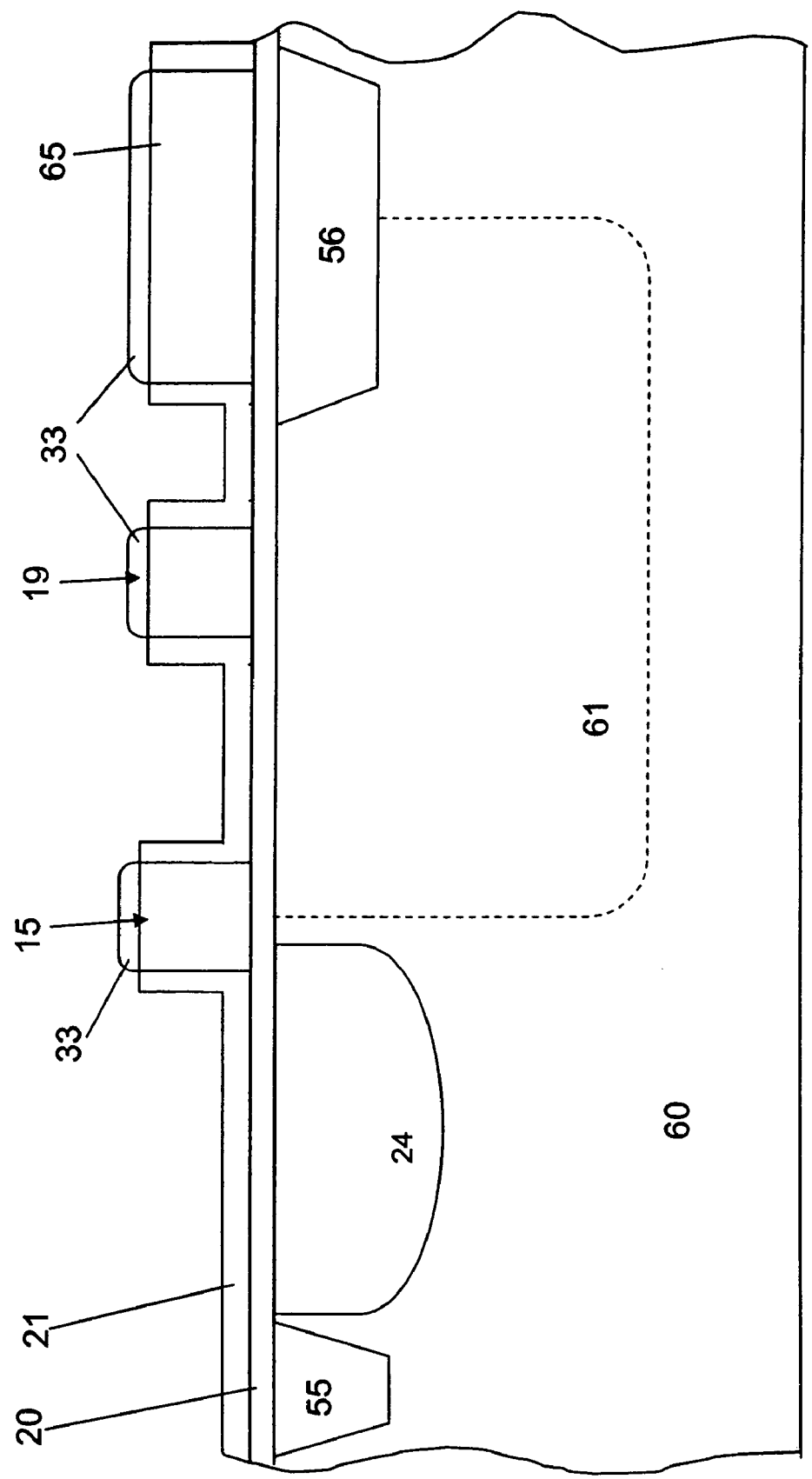
FIG. 9 shows a stage of processing subsequent to that shown in FIG. 8.

Metal layer 27 on $SiO_2$ layer 25 is removed by wet etching using, for example, ammonium hydroxide ($NH_4OH$) and hydrogen peroxide ($H_2O_2$). $SiO_2$ layer 25 is also removed. After the wet etch process, only silicide caps 33 over the tops of the gate stacks 15, 19 and bottom electrode 65 remain, as illustrated in FIG. 9. Although not shown in FIG. 9, it should be understood that silicide caps 33 may also be formed over a source follower transistor gate stack and a row select transistor gate stack or any other additional transistor gate stacks within the pixel. Similarly, silicide caps 33 may be formed over transistor gates and capacitor electrodes in peripheral areas around the pixel. A second annealing step can be performed after removal of metal layer 27 and before removal of $SiO_2$ layer 25 to stabilize the silicide regions 33.

Figure 10:
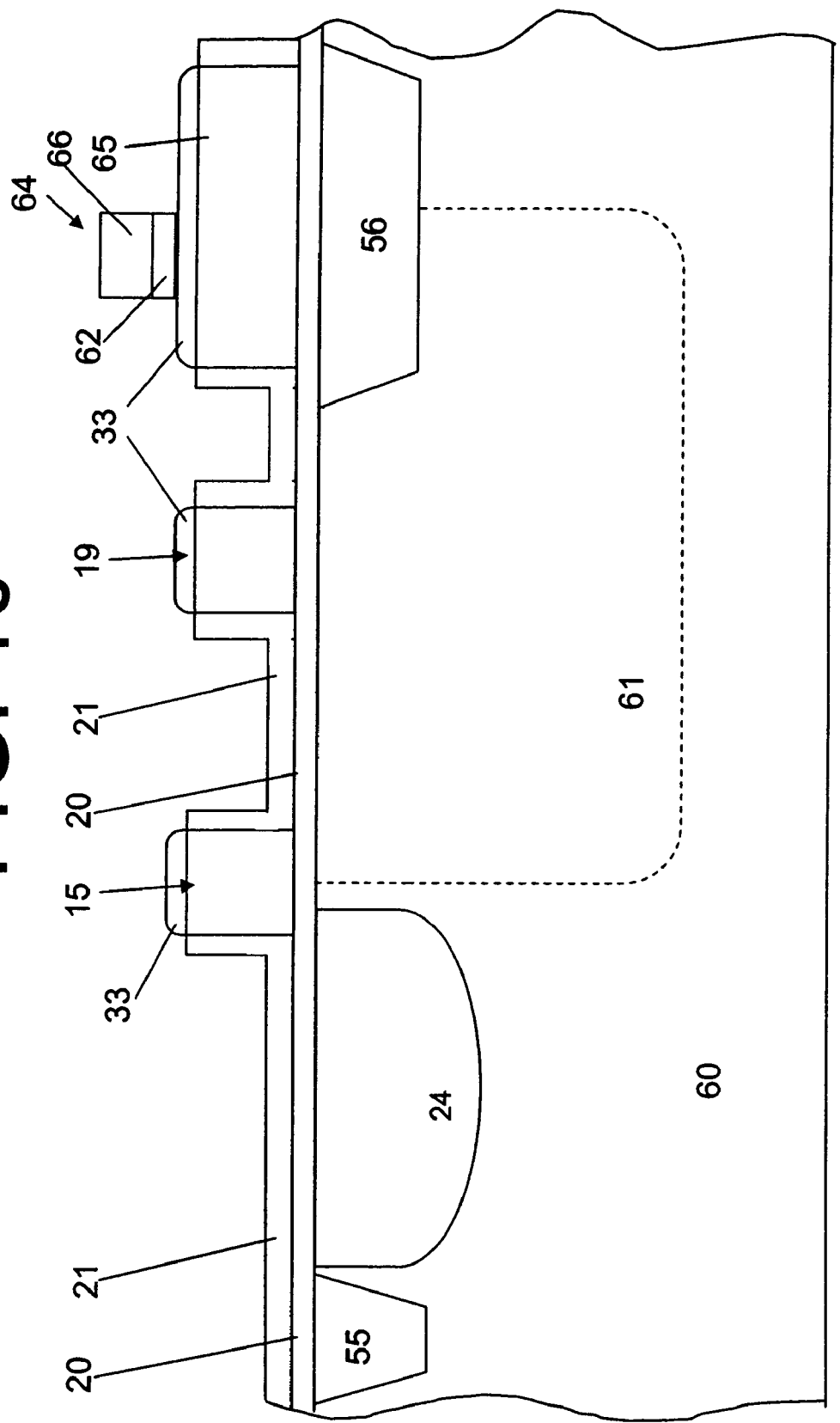
FIG. 10 shows a stage of processing subsequent to that shown in FIG. 9.

FIG. 10 shows top electrode 64, which is formed by deposition of a dielectric layer 62 and deposition of a conductive layer 66. The dielectric layer 62 may be formed of an oxide, nitride, $Al_2O_3$, $Ta_2O_5$, or BST material, or any other nonconductor of direct electric current. The conductive layer 66 may be formed of any suitable electrode material, including but not limited to metals, metal alloys, conductive metal oxides or combinations of such metals, metal alloys and conductive metal oxides. Alternatively, the conductive layer 66 may be formed of doped polysilicon, or conductive combinations of polysilicon and other metals and compositions, such as polysilicon/HSG (hemispherical grained polysilicon), polysilicon/WSi and polysilicon/WN/W, among others. In the illustrated embodiment, conductive layer 66 is formed of polysilicon.

The conductive layer 66 and the dielectric layer 62 are patterned by depositing a photoresist layer, photolithographic patterning the photoresist to form a mask, and then anisotropically etching through the mask, to obtain upper electrode stack 64 located above lower electrode 65 and the STI region 56.

Figure 11:
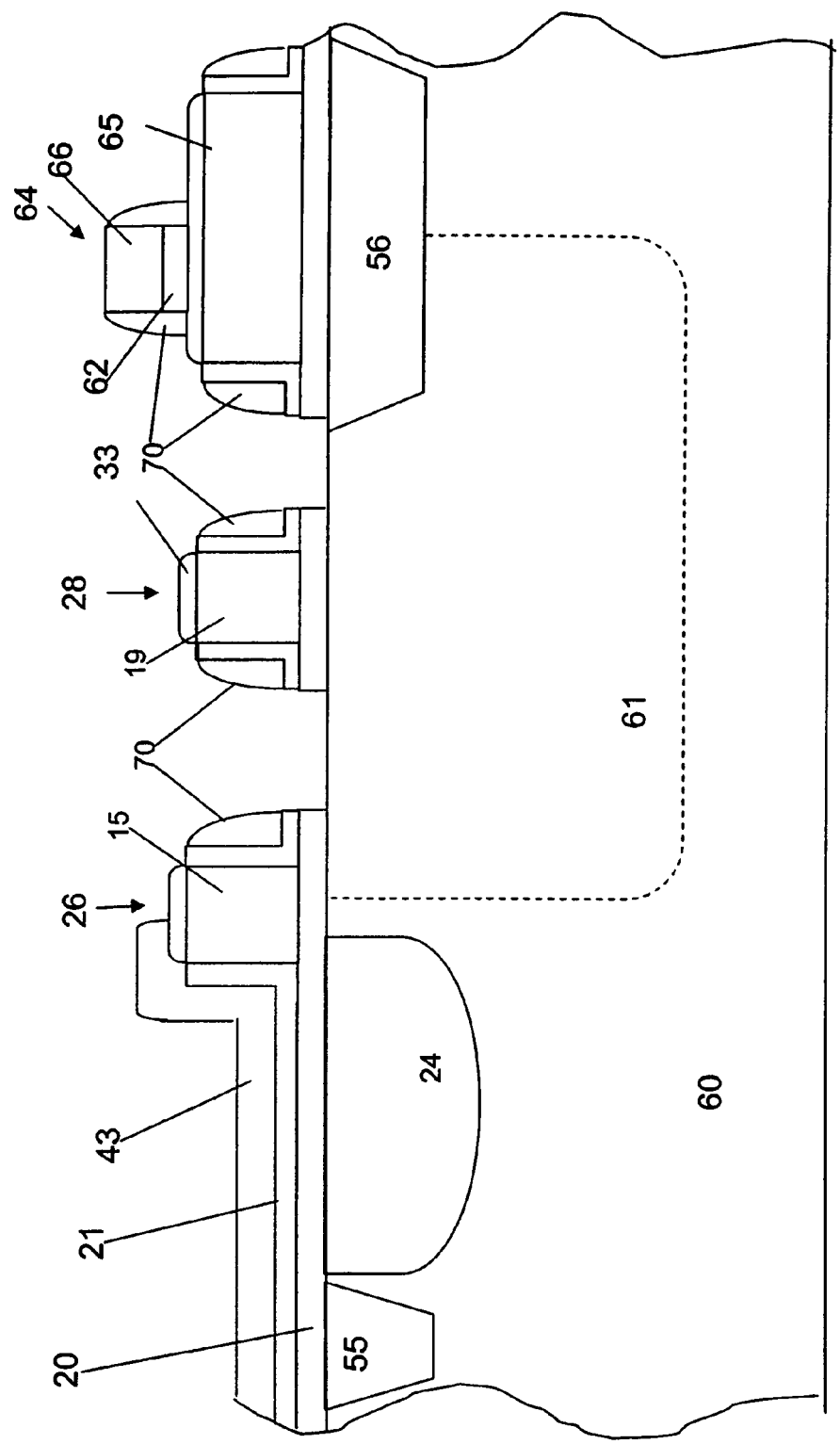
FIG. 11 shows a stage of processing subsequent to that shown in FIG. 10.

FIG. 11 shows a formed protective layer 43 and sidewalls 70, which are formed by depositing a spacer layer and a photoresist layer, photolithographically patterning the photoresist to form a mask that covers areas in which protective layer 43 will remain, and then anisotropically etching exposed areas of the spacer layer as well as layers 21, 20. The etch leaves sidewalls 70 on the sides of gate stacks 15, 19 and capacitor electrode structures 64, 65 (if capacitor 51 is to be included). Sidewalls 70 and protective layer 43 may be formed of a suitable material such as, for example, silicon dioxide ($SiO_2$), and act as a mask during subsequent doping operations. Sidewall etching removes exposed portions of layers 21, 20 to expose substrate 60 where floating diffusion region 16 and source/drain regions 30 will be formed. Layer 43 remains over the photodiode area and a portion of the transfer transistor gate 26 and protects the photodiode area from being damaged during sidewall etching and other operations.

Figure 12:
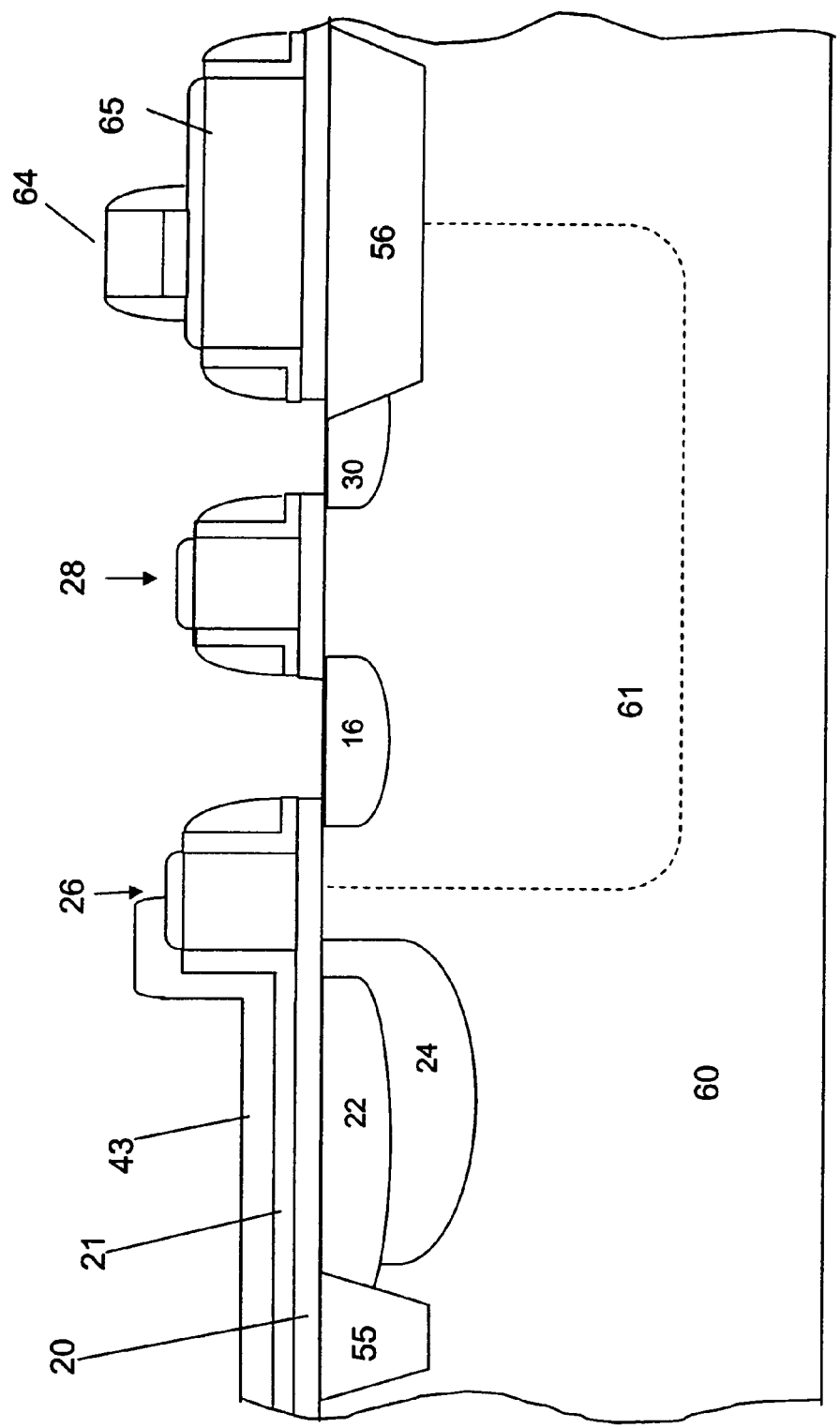
FIG. 12 shows a stage of processing subsequent to that shown in FIG. 11.
Figure 13:
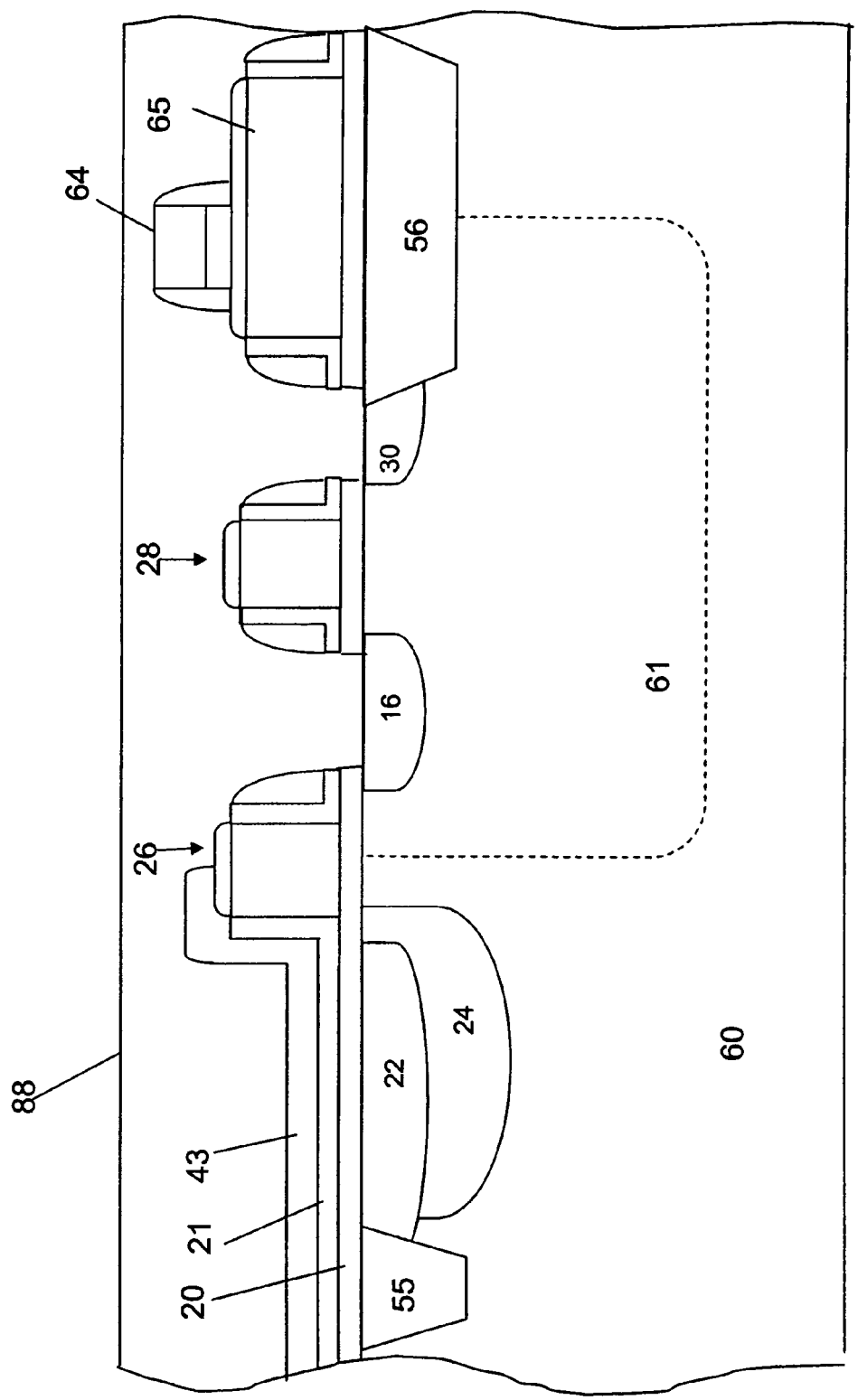
FIG. 13 shows a stage of processing subsequent to that shown in FIG. 12.
Figure 14:
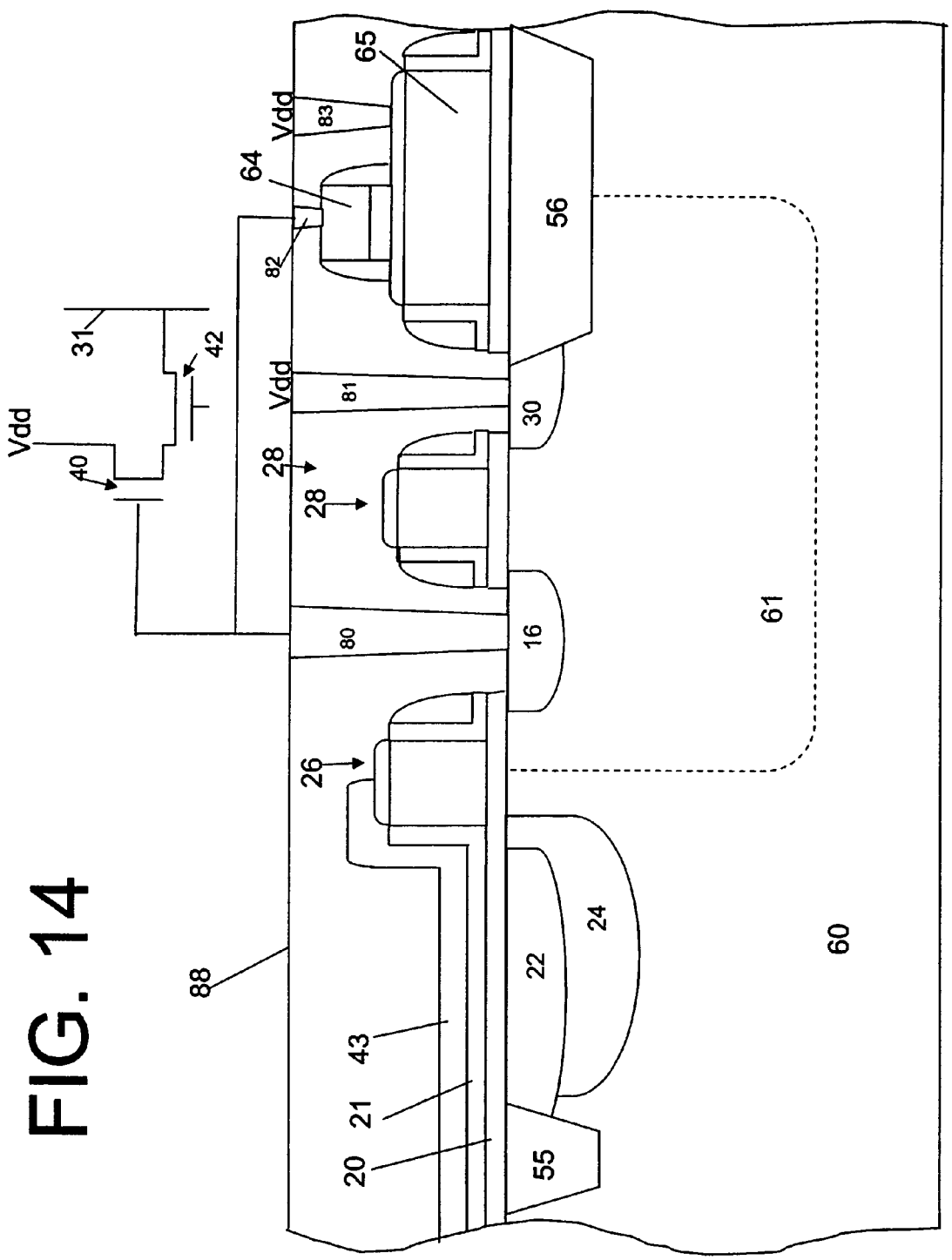
FIG. 14 shows a stage of processing subsequent to that shown in FIG. 13.

FIG. 12 depicts doped regions 16, 30, which are formed in the p-well 61 and are doped to an n-type conductivity in the illustrated embodiment. For exemplary purposes, the regions 16, 30 are n+ doped by ion implantation using sidewalls 70 as a mask in accordance with lightly doped drain (LDD) techniques. A surface p+ implantation is also performed with appropriate masking to produce p+ region 22. Similar doping can be performed in peripheral areas (not shown).

The pixel sensor cell is essentially complete at this stage, and conventional processing methods may be used to form insulating, shielding, and metallization layers to connect gate lines and other connections to the pixel sensor cells. For example, the entire surface may be covered with a passivation layer 88 (FIG. 13) of, for example, silicon dioxide, boro-silicate glass (BSG), phosphosilicate glass (PSG), or boro-phospho-silicate glass (BPSG), which is CMP planarized and etched to provide contact holes, which are then metallized to provide contacts, shown in FIG. 14 as contacts 80, 81, 82, 83. Conventional photolithographically patterned layers of conductors and insulators may also be used to interconnect the structures and to connect the pixel to peripheral circuitry.

A pixel sensor cell constructed according to the embodiment described above allows a silicide layer to be formed over polysilicon areas without contamination of other components of the pixel. A silicide layer over the tops of gate stacks or electrodes of a capacitor reduces polysilicon resistivity characteristics which is desirable. The optional in-pixel capacitor 51 imparts improved stabilized capacitance versus voltage characteristics due to its metal-dielectric-polysilicon structure where the metal is in silicide cap 33.

Figure 15:
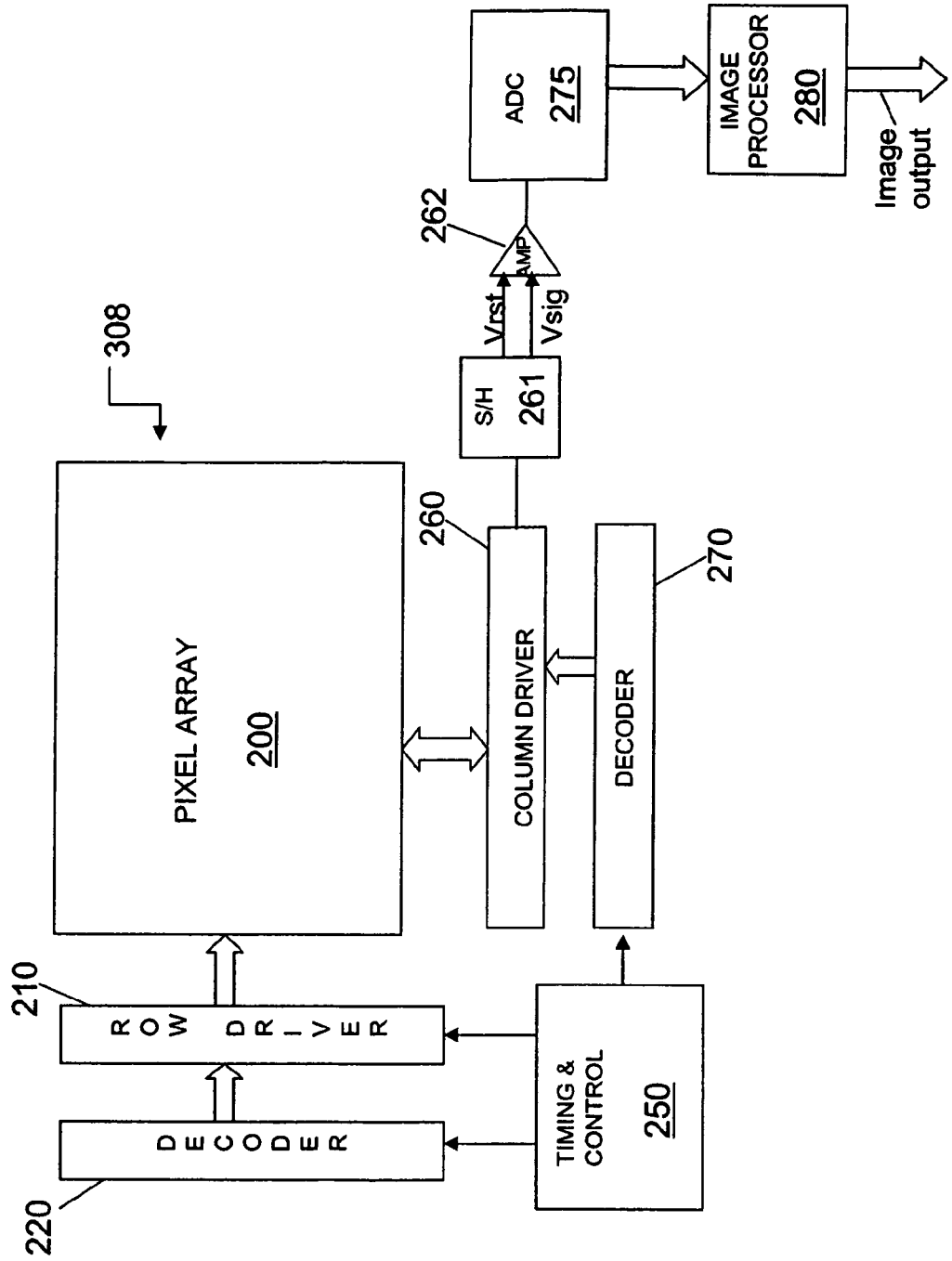
FIG. 15 is a block diagram of an imager integrated circuit (IC) having a pixel array that includes pixel cells as in FIG. 1.

FIG. 15 illustrates a block diagram of an exemplary CMOS imager IC 308 having a pixel array 200 with each pixel cell being constructed as described above. Pixel array 200 comprises a plurality of pixels arranged in a predetermined number of columns and rows (not shown). The pixels of each row in array 200 are all selected for readout at the same time by a row select line, and signals from the pixels of each column are selectively output by respective column select lines. A plurality of row and column lines are provided for the entire array 200. The row lines are selectively activated by a row driver 210 in response to row address decoder 220. The column select lines are selectively activated by a column driver 260 in response to column address decoder 270. Thus, a row and column address is provided for each pixel.

The CMOS imager IC 308 is operated by the timing and control circuit 250, which controls address decoders 220, 270 for selecting the appropriate row and column lines during pixel readout. The control circuit 250 also controls the row and column driver circuitry 210, 260 to apply driving voltages to the drive transistors of the selected row and column lines. The pixel column signals, which typically include a pixel reset signal ($V_{rst}$) and a pixel image signal ($V_{sig}$), are read by a sample and hold circuit 261 associated with the column driver 260. A differential signal ($V_{rst}-V_{sig}$) is produced by differential amplifier 262 for each pixel, and the differential signal is digitized by analog-to-digital converter 275 (ADC). The analog-to-digital converter 275 supplies the digitized pixel signals to an image processor 280, which forms a digital image output.

FIG. 16 shows a processor system 300, which includes an imager IC 308 (FIG. 15). That is, the imager IC 308 includes a pixel array having pixels in which polysilicon areas have silicide caps. System 300 includes a processor 302 having a central processing unit (CPU) that communicates with various devices over a bus 304. Some of the devices connected to the bus 304 provide communication into and out of the system 300; an input/output (I/O) device 306 and imager IC 308 are such communication devices. Other devices connected to the bus 304 provide memory, illustratively including a random access memory (RAM) 310, hard drive 312, and one or more peripheral memory devices such as a floppy disk drive 314 and compact disk (CD) drive 316. The imager IC 308 may, in turn, be coupled to processor 302 for image processing, or other image handling operations.

Embodiments of the invention employing silicide on top of polysilicon areas have the advantages of reduced contamination on other components of the imager during processing and reduced polysilicon resistance characteristics. Embodiments of the invention can be used on image sensors, including but not limited to CCD and CMOS imagers, and on other ICs with conductive silicon structures on substrate.

The processes and devices described above illustrate exemplary methods and devices of many that could be used and produced. The above description and drawings illustrate embodiments, which achieve the objects, features, and advantages of the present invention. However, it is not intended that the present invention be strictly limited to the above-described and illustrated embodiments. Any modifications, though presently unforeseeable, of the present invention that come within the spirit and scope of the following claims should be considered part of the present invention.

What is claimed as new desired to be protected by Letters Patent of the United States is:

1. A method of forming an imager:
    forming at least one pixel cell having a photosensor in an array region of a substrate;
    forming circuitry in a peripheral region of said substrate and electrically connected to said at least one pixel cell; and
    forming at least one silicided transistor gate stack over a surface of a substrate in either said array or said peripheral region, wherein the act of forming comprises:
        forming at least one gate stack over said substrate surface;
        covering said photosensor with an etch stop layer;
        depositing a non-reactive layer over the photosensor and over said at least one gate stack;
        planarizing said etch stop layer and said non-reactive layer such that top surfaces of said at least one gate stack are exposed;
        depositing a metal layer over said non-reactive layer; and
        annealing said metal to form a silicide on the top surfaces of said at least one gate stack.

2. The method of claim 1, wherein said gate stack is at least partially formed of polysilicon.

3. The method of claim 1, wherein said non-reactive layer is formed of silicon dioxide and said method further comprises etching the non-reactive layer and any metal on it down to the etch stop layer, leaving the silicide on the top surfaces of said at least one gate stack.

4. The method of claim 1, wherein said etch stop layer is formed of silicon nitride.

5. The method of claim 1, wherein said metal layer is a silicide layer of a bottom electrode of a capacitor.

6. The method of claim 5, wherein said silicide layer is formed on the top surface of said bottom electrode and is formed at a same time as the silicide on the top surfaces of said at least one gate stack.

7. The method of claim 1, wherein said metal layer comprises at least one of cobalt, titanium and nickel.

8. The method of claim 1, wherein said annealing step includes a rapid thermal anneal.

9. The method of claim 8, wherein said rapid thermal anneal is performed at a temperature of about 800° C.

10. A method of forming an imager integrated circuit comprising:
    forming a photodiode in a substrate;
    forming at least one transistor gate stack over a surface of the substrate by the acts of:
        forming a conductive layer that includes silicon material and has an upper surface; and
        etching said conductive layer to form said at least one transistor gate stack;
    covering said photodiode with an insulating layer; and
    while said photodiode is covered, forming a silicide layer on the upper surface of said at least one transistor gate stack, wherein the upper surface of the transistor gate stack and the silicide layer have aligned edges.

11. The method of claim 10, wherein the act of forming a silicide layer comprises depositing a metal layer and annealing the metal layer.

12. The method of claim 11, wherein the metal comprises one of cobalt, titanium, tungsten and nickel.

13. The method of claim 10, wherein the act of forming a conductive layer comprises forming an electrode for a capacitor.

14. The method of claim 10, wherein said first insulating layer comprises one of silicon nitride and silicon dioxide.

15. The method of claim 10, further comprising the act of forming a passivation layer over said substrate.

16. The method of claim 15, wherein the passivation layer comprises one of silicon dioxide, boro-silicate glass, phosposilicoate glass, or boro-phospho-silicate glass.

17. The method of claim 16, further comprising the act of etching said passivation layer to create empty spaces in said passivation layer for further processing.

* * * * *

UNITED STATES PATENT AND TRADEMARK OFFICE
CERTIFICATE OF CORRECTION

PATENT NO. : 7,344,937 B2  Page 1 of 1
APPLICATION NO. : 11/339839
DATED : March 18, 2008
INVENTOR(S) : Hong It is certified that error appears in the above-identified patent and that said Letters Patent is hereby corrected as shown below:

In column 10, lines 2-3, in Claim 16, delete "phosposilicoate" and insert
-- phosphosilicate --, therefor.

Signed and Sealed this

Seventeenth Day of June, 2008

JON W. DUDAS
*Director of the United States Patent and Trademark Office*